United States Patent
Chen et al.

(10) Patent No.: US 8,052,001 B2
(45) Date of Patent: Nov. 8, 2011

(54) CASE ASSEMBLY STRUCTURE OF ELECTRONIC DEVICE

(75) Inventors: Chun-Chen Chen, Taoyuan Hsien (TW); Li-Yen Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 910 days.

(21) Appl. No.: 12/046,688

(22) Filed: Mar. 12, 2008

(65) Prior Publication Data

US 2008/0278892 A1 Nov. 13, 2008

Related U.S. Application Data

(63) Continuation-in-part of application No. 11/776,400, filed on Jul. 11, 2007, now abandoned.

(30) Foreign Application Priority Data

May 10, 2007 (TW) ............... 96116704 A
Nov. 6, 2007 (TW) ............... 96141926 A

(51) Int. Cl.
*B65D 43/08* (2006.01)
*B65D 43/06* (2006.01)

(52) U.S. Cl. ............... 220/4.02; 220/4.21; 220/797

(58) Field of Classification Search ............... 220/4.02, 220/4.21, 796, 797
See application file for complete search history.

(56) References Cited

U.S. PATENT DOCUMENTS

| | | | | |
|---|---|---|---|---|
| 2,720,332 A * | 10/1955 | Holt | | 220/4.24 |
| 4,368,819 A * | 1/1983 | Durham | | 206/545 |
| 4,792,055 A * | 12/1988 | Schupack et al. | | 220/324 |
| 5,310,075 A * | 5/1994 | Wyler | | 220/4.02 |
| 5,531,345 A * | 7/1996 | Nakamura et al. | | 220/3.8 |
| 5,574,254 A * | 11/1996 | Mori et al. | | 174/561 |
| 5,658,551 A * | 8/1997 | Schneider et al. | | 424/9.51 |
| 5,782,370 A * | 7/1998 | Kamiya | | 220/4.02 |
| 6,492,590 B1 * | 12/2002 | Cheng | | 174/50 |
| 6,545,217 B2 * | 4/2003 | Sato | | 174/50 |
| 6,629,629 B2 * | 10/2003 | Lee et al. | | 224/583 |
| 6,927,335 B2 * | 8/2005 | Lim et al. | | 174/50 |
| 2007/0164020 A1 * | 7/2007 | Arnett et al. | | 220/4.21 |

* cited by examiner

*Primary Examiner* — Mickey Yu
*Assistant Examiner* — Niki Eloshway
(74) *Attorney, Agent, or Firm* — Kirton & McConkie; Evan R. Witt

(57) ABSTRACT

The present invention relates to a case assembly structure. The case assembly structure includes a first case and a second case. The first case has a first connection portion including a first protrusion, a first trench and a second protrusion from an external side to an internal side thereof. The second case has a second connection portion including a third protrusion and a second trench from an external side to an internal side thereof. The first trench and the second protrusion of the first connection portion of the first case are corresponding to the third protrusion and the second trench of the second connection portion of the second case, and an inner wall of the first protrusion of the first connection portion of the first case is in contact with the external side of the second connection portion of the second case such that the first case and the second case are combined together.

18 Claims, 7 Drawing Sheets

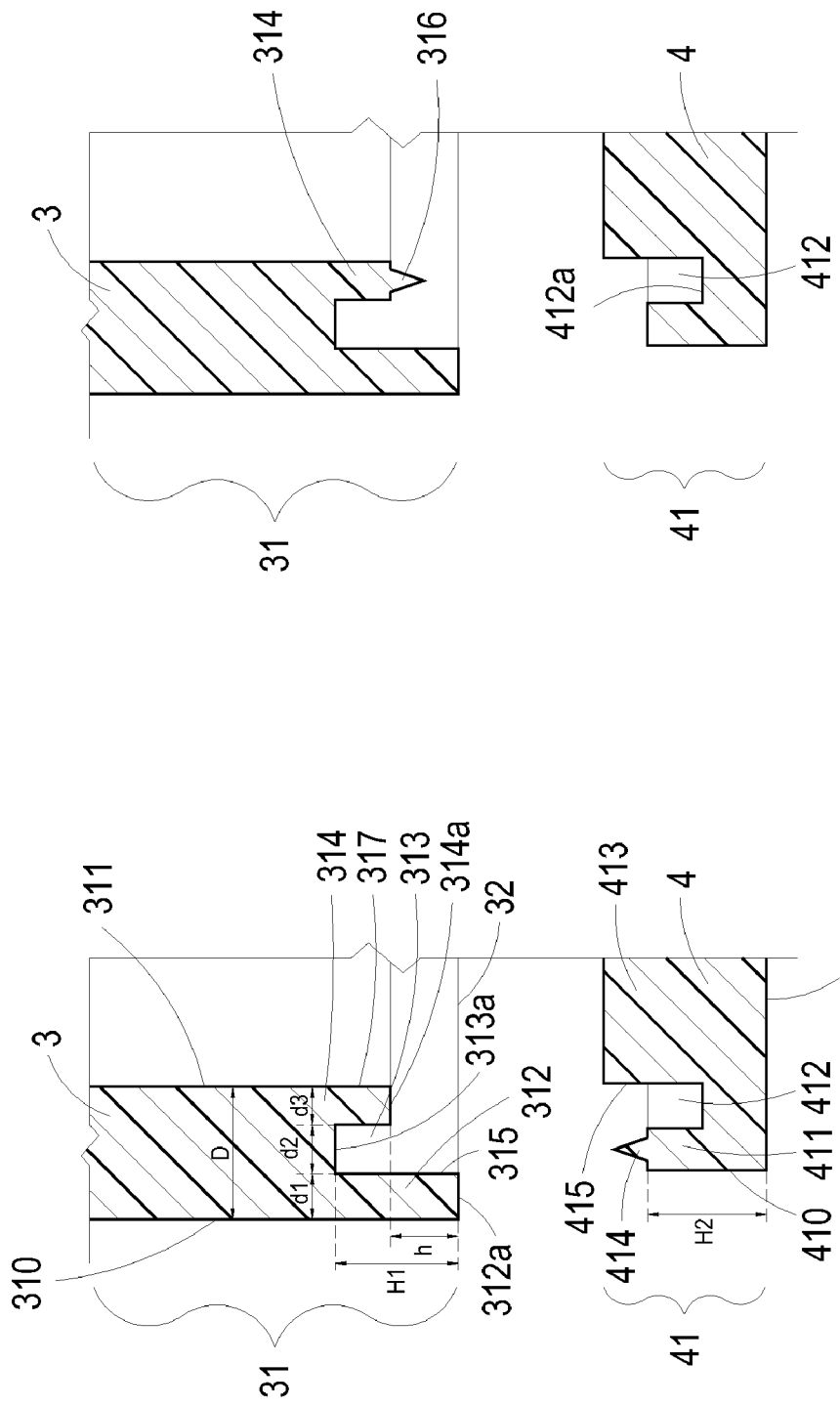

CASE ASSEMBLY STRUCTURE OF ELECTRONIC DEVICE

FIELD OF THE INVENTION

This application is a continuation-in-part of U.S. patent application Ser. No. 11/776,400, filed on Jul. 11, 2007, and entitled "CASE ASSEMBLY STRUCTURE OF ELECTRONIC DEVICE". The entire disclosures of the above application are all incorporated herein by reference.

BACKGROUND OF THE INVENTION

In our daily lives, various electronic devices such as power adapters, transformers, power supply apparatuses, electrical connectors and the like are widely used. Since the internal electronic components and the circuits of these electronic devices need to be appropriately isolated and protected, these electronic devices are usually covered by cases to avoid the contact with the external environment. The assembly structure of the case and the assembling method thereof may indirectly influence the appearances and the electric properties of the electronic apparatuses or accessories. It is important to design an appropriate case assembly structure.

Referring to FIG. 1, a schematic cross-sectional view of a conventional case assembly structure is illustrated. As shown in FIG. 1, the case assembly structure includes an upper case 1 and a lower case 2. The upper case 1 has a first connection portion 11. Corresponding to the first connection portion 11, the lower case 2 has a second connection portion 21. When the first connection portion 11 and the second connection portion 21 are engaged with each other, the upper case 1 and the lower case 2 are combined together to implement the case assembly structure.

FIG. 2 is a schematic partial enlarged view illustrating the first connection portion 11 of the upper case 1 and the second connection portion 21 of the lower case 2. From the external side 110 to the internal side 111 of the upper case 1, the first connection portion 11 of the upper case 1 includes a first protrusion 112, a first trench 113 and a second protrusion 114. From the external side 210 to the internal side 211 of the lower case 2, the second connection portion 21 of the lower case 2 includes a first concave portion 212, a third protrusion 213 and a second concave portion 214 facing to the first protrusion 112, the first trench 113 and the second protrusion 114 of the first connection portion 11, respectively. In addition, the third protrusion 213 of the second connection portion 21 has a protruding rib 215 thereon, and the width of the third protrusion 213 is slightly smaller than that of the first trench 113 of the first connection portion 11. When the third protrusion 213 of the second connection portion 21 is inserted into the first trench 113 of the first connection portion 11, the upper case 1 and the lower case 2 are combined together.

Please refer to FIGS. 3A and 3B, which are schematic cross-sectional views showing the assembling process of the case assembly structure in FIG. 2. As shown in FIG. 3A, for assembling the upper case 1 and the lower case 2, the first protrusion 112, the first trench 113 and the second protrusion 114 of the upper case 1 are firstly placed to face to the first concave portion 212, the third protrusion 213 and the second concave portion 214 of the lower case 2, respectively. Then, according to an ultrasonic welding technology, the ultrasound generated by the horn of an ultrasonic plastic welding machine produces ultra-frequent sonic vibration on the cases. Under this circumstance, the upper case 1 and the lower case 2 rub against each other violently and thus the protruding rib 215 on the third protrusion 213 of the lower case 2 can be molten and welded into the inner wall of the first trench 113 of the upper case 1 in a very short time, as can be seen in FIG. 3B. Meanwhile, the purpose of assembling the upper case 1 and the lower case 2 is achieved.

However, after the upper case 1 and the lower case 2 are assembled, the creepage distance formed between the connection portions 11 and 21 is not long enough. As a consequence, the electric leakage may occur, which indirectly influence the electric properties of the electronic device. Moreover, since the bonding strength between the upper case 1 and the lower case 2 is insufficient, the electronic device fails to withstand a stronger impact. For solving these drawbacks, the thicknesses of the connection portions 11 and 21 need to be greater than 3 mm, which increases material consumption. Moreover, for increasing the creepage distance, the length of the second protrusion 114 of the first connection portion 11 should be long enough. In a case that an external force perpendicular to the external sides of the connection portions 11 and 21, the second protrusion 114 or even the case assembly structure is readily fractured due to the structural fragility.

Therefore, there is a need of providing a case assembly structure having increased creepage distance and bonding strength so as to overcome the disadvantages of the prior art as described above.

SUMMARY OF THE INVENTION

It is an object of the present invention to provide a case assembly structure having increased creepage distance and bonding strength, thereby improving the structural strength and the electric properties of the electronic device.

In accordance with an aspect of the present invention, there is provided a case assembly structure of an electronic device. The case assembly structure includes a first case and a second case. The first case has a first connection portion including a first protrusion, a first trench and a second protrusion from an external side to an internal side thereof. The second case has a second connection portion including a third protrusion and a second trench from an external side to an internal side thereof. The first trench and the second protrusion of the first connection portion of the first case are corresponding to the third protrusion and the second trench of the second connection portion of the second case, and an inner wall of the first protrusion of the first connection portion of the first case is in contact with the external side of the second connection portion of the second case such that the first case and the second case are combined together.

In accordance with another aspect of the present invention, there is provided a case assembly structure of an electronic device. The case assembly structure includes a first case and a second case. The first case has a first connection portion including a first protrusion, a first trench and a second protrusion from an external side to an internal side thereof, wherein an entrance is defined by the first protrusion of the first case. The second case has a second connection portion including a third protrusion and a second trench from an external side to an internal side thereof. The first trench and the second protrusion of the first connection portion of the first case are corresponding to the third protrusion and the second trench of the second connection portion of the second case, and the second case is inserted into the entrance of the first case such that the first case and the second case are combined together.

The above contents of the present invention will become more readily apparent to those ordinarily skilled in the art after reviewing the following detailed description and accompanying drawings, in which:

BRIEF DESCRIPTION OF THE DRAWINGS

FIG. 6 is a schematic partial enlarged view illustrating the first connection portion of the first case and the second connection portion of the second case;

FIG. 7 is a schematic partial enlarged view illustrating a variant embodiment of the first connection portion of the first case and the second connection portion of the second case.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
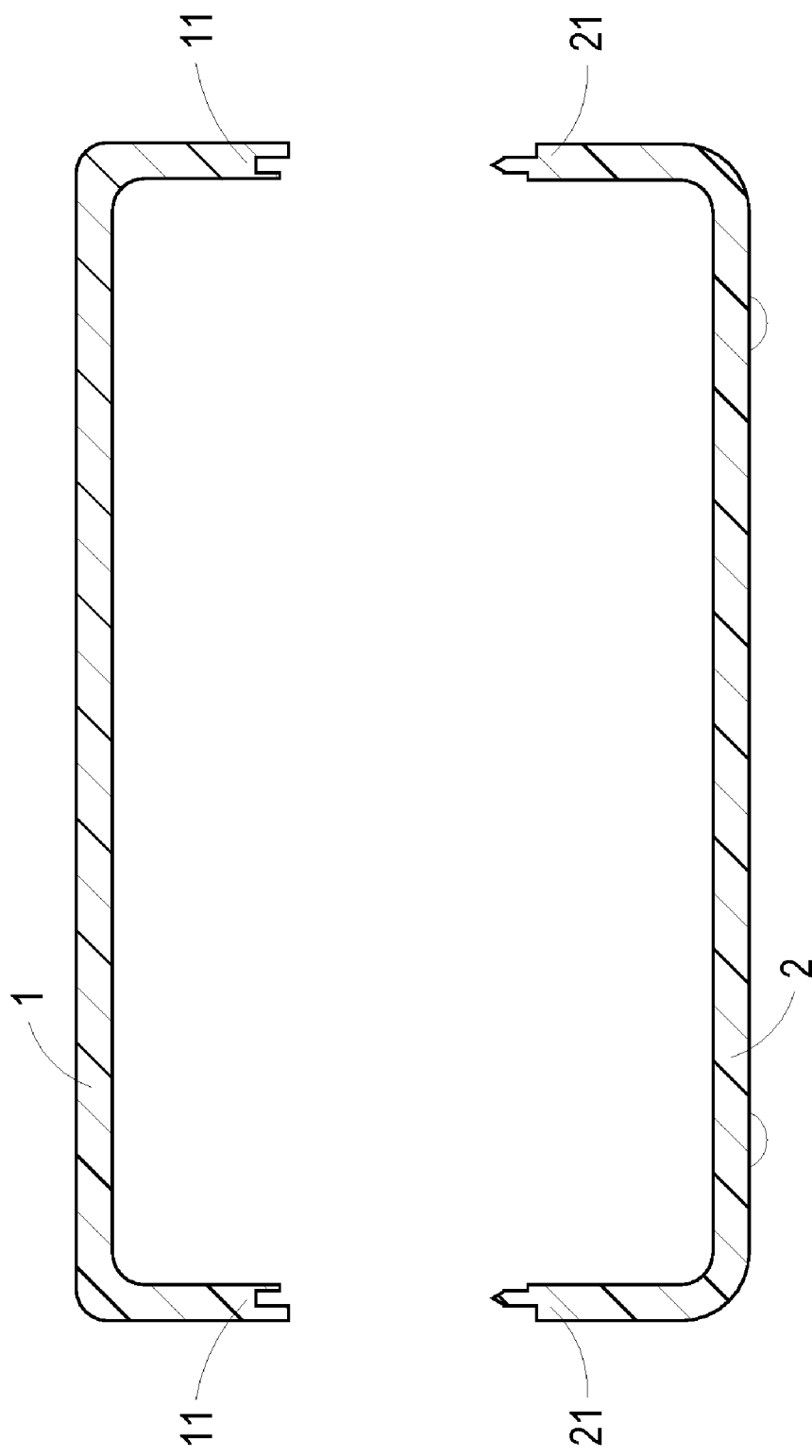
FIG. 1 is a schematic cross-sectional view of a conventional case assembly structure.
Figure 2:
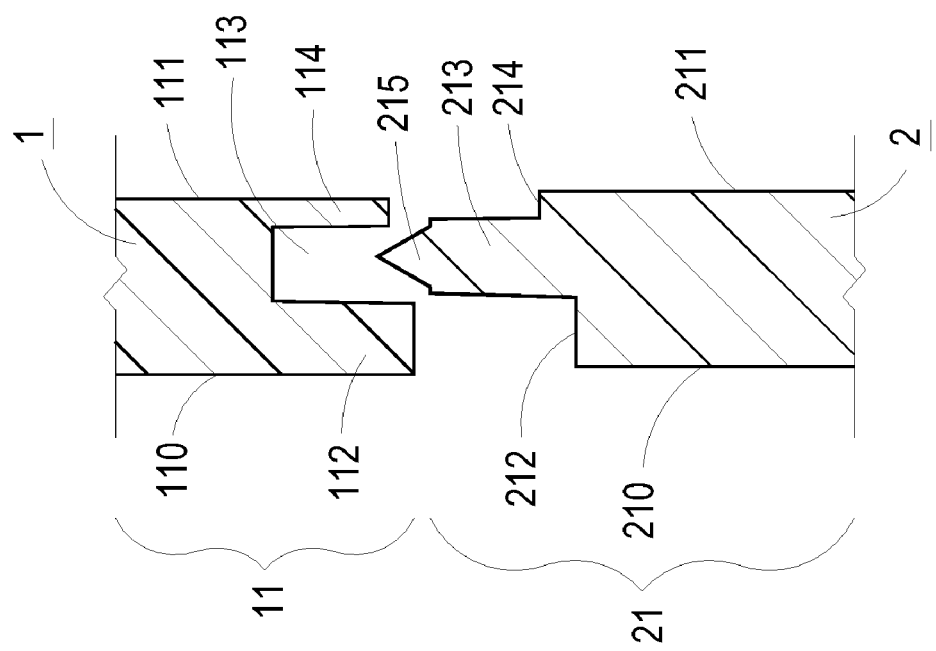
FIG. 2 is a schematic partial enlarged view illustrating the first connection portion of the upper case and the second connection portion of the lower case.
Figure 3B:
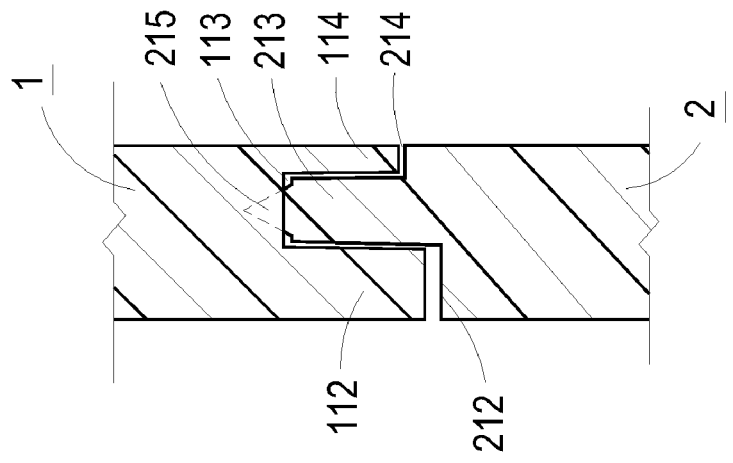
FIGS. 3A and 3B are schematic cross-sectional views showing the assembling process of the case assembly structure in FIG. 2.
Figure 3A:
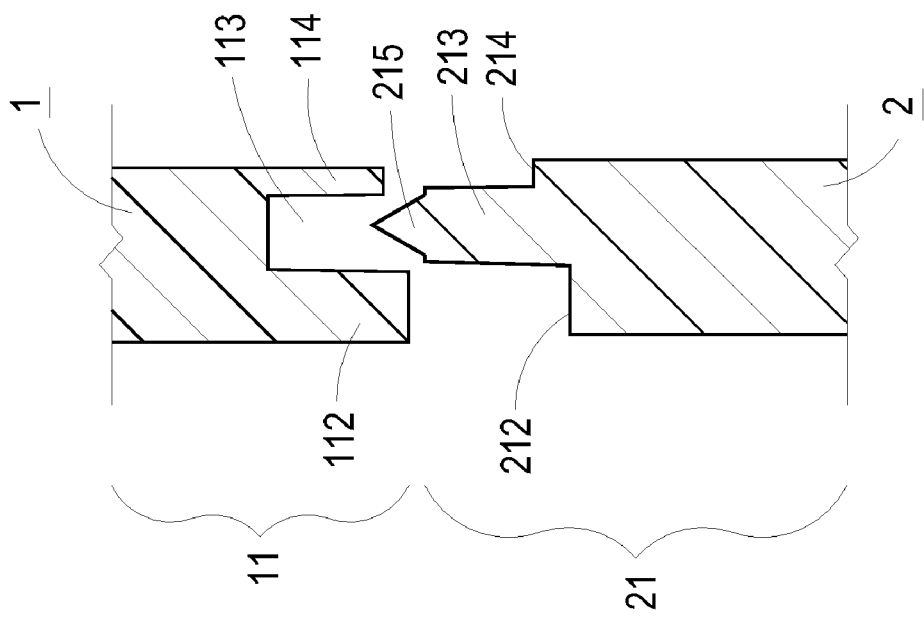
Figure 4:
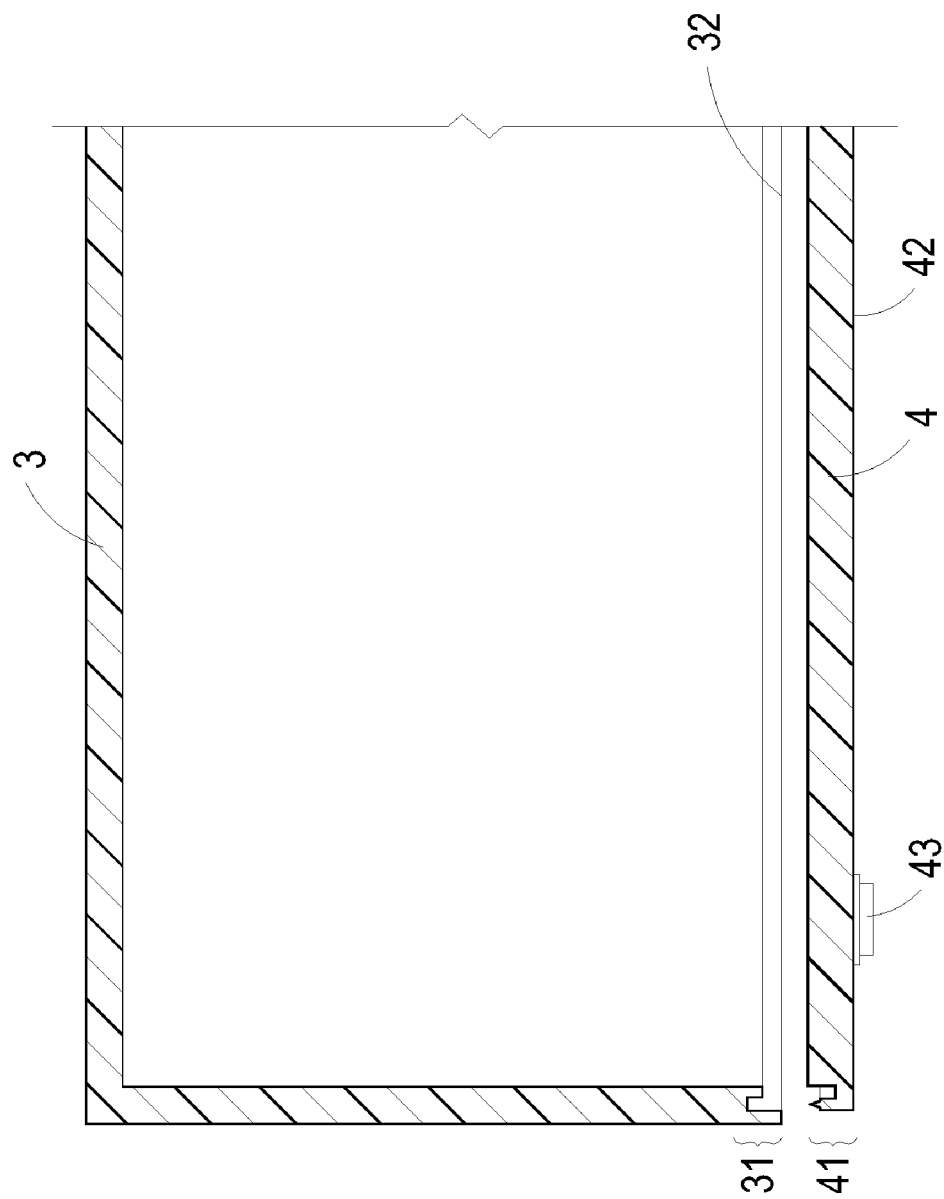
FIG. 4 is a schematic cross-sectional view of a case assembly structure according to a preferred embodiment of the present invention.
Figure 5:
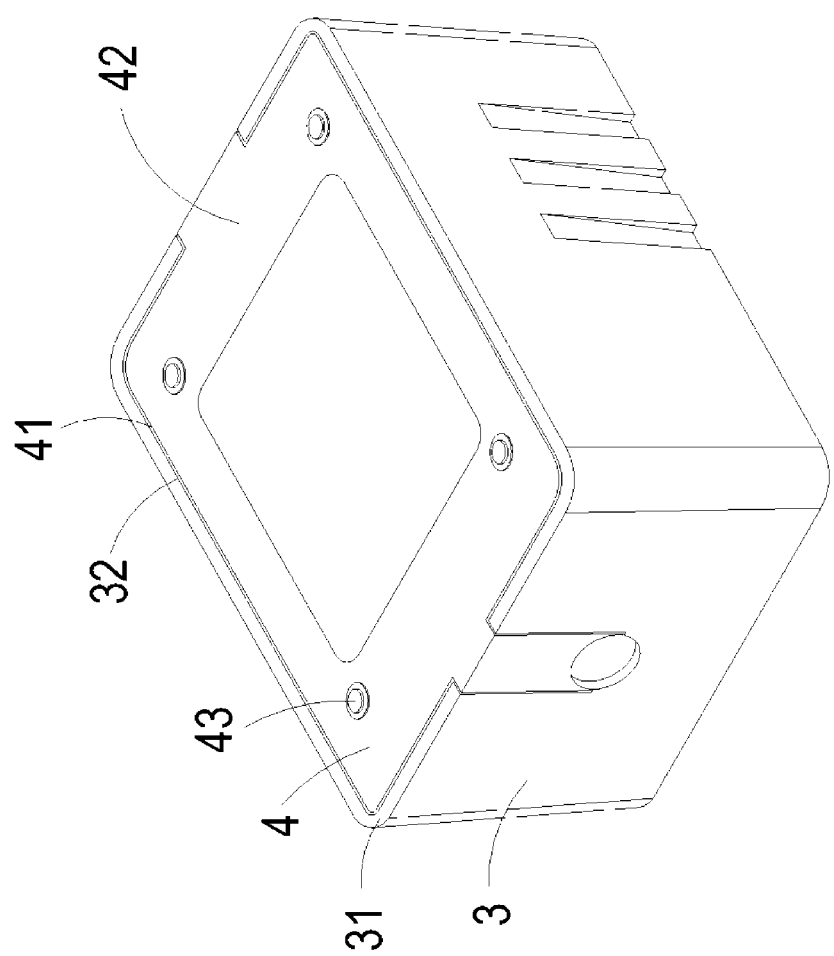
FIG. 5 is a schematic perspective view of the case assembly structure in FIG. 4.

Referring to FIG. 4, a schematic cross-sectional view of a case assembly structure according to a preferred embodiment of the present invention is illustrated. The case assembly structure of the present invention can be applied to the power adapters, transformers, power supply apparatuses, and electrical connectors, but not limited thereto. As shown in FIG. 4, the case assembly structure includes a first case 3 and a second case 4. The first case 3 has a first connection portion 31. Corresponding to the first connection portion 31, the second case 4 has a second connection portion 41. When the first connection portion 31 and the second connection portion 41 are engaged with each other, the first case 3 and the second case 4 are combined together to implement the case assembly structure. In some embodiments, the first case 3 is preferably a box and the second case 4 is preferably a lid or a plate. The first case 3 has an entrance 32 mating with the external profile of the second case 4. When the second case 4 is inserted into the entrance 32 of the first case 3, the first case 3 and the second case 4 are combined together to form a case assembly structure as shown in FIG. 5. In some embodiments, when the second case 4 is tight-fitted into the entrance 32 of the first case 3, the tip of the connection portion 31 of the first case 31 is substantially at the same level with the bottom surface 42 of the second case 4. In some other embodiments, a plurality of support elements are disposed on the bottom surface 42 of the second case 4 for supporting the electronic device when placed on a plane.

FIG. 6 is a schematic partial enlarged view illustrating the first connection portion 31 of the first case 3 and the second connection portion 41 of the second case 4. From the external side 310 to the internal side 311 of the first case 3, the first connection portion 31 of the first case 3 includes a first protrusion 312, a first trench 313 and a second protrusion 314, wherein the first trench 313 is defined and formed between the first protrusion 312 and the second protrusion 314, and there is a height difference h between the tip 312a of the first protrusion 312 and the tip 314a of the second protrusion 314. From the external side 410 to the internal side of the second case 4, the second connection portion 41 of the second case 4 includes a third protrusion 411, a second trench 412 and a platform 413, wherein the second trench 412 is defined and formed between the second protrusion 411 and the platform 413.

In the embodiments, the inner wall 315 of the first protrusion 312 of the first case 3 is corresponding to the external side 410 of the second connection portion 41 of the second case 4, the first trench 313 and the second protrusion 314 of the first case 3 are corresponding to the third protrusion 411 and the second trench 412 of the second case 4, respectively, and the side 317 of the second protrusion 314 of the first case 3 is corresponding to the side 415 of the platform 413 of the second case 4. In addition, the width of the third protrusion 411 of the second case 4 is slightly smaller than that of the first trench 313 of the first case 3, and the width of the second protrusion 314 of the first case 3 is slightly smaller than that of the second trench 412 of the second case 4. Furthermore, the total width including the width d1 of the first protrusion 312, the width d2 of the first trench 313 and the width d3 of the second protrusion 314 of the connection portion 31 of the first case 3 is substantially equal to the thickness D of the first case 3 in the non-connection portion, and thus, the external side 310 of the connection portion 31 of the first case 3 is planar and is positioned in the same line with the external side of the non-connection portion of the first case 3. The entrance 32 is defined by the first protrusion 312 of the first case 3, and the second case 4 is tight-fitted into the entrance 32 of the first case 3. That is, the inner wall 315 of the first protrusion 312 is in close contact with the external side 410 of the second connection portion 41 of the second case 4. Since the height H1 of the inner wall 315 of the first protrusion 312 of the first case 3 is substantially equal to the height H2 of the external side 410 of the second connection portion 41 of the second case 4, when the second case 4 is tight-fitted into the entrance 32 of the first case 3, the tip 312a of the first protrusion 312 of the first case 3 is substantially at the same level with the bottom surface 42 of the second case 4.

In some embodiments, the third protrusion 411 of the second case 4 further has a protruding rib 414 thereon. According to an ultrasonic welding technology, the protruding rib 414 on the third protrusion 411 of the second case 4 can be welded or implanted into the inner wall 313a of the first trench 313 of the first case 3, so that the first case 3 and the second case 4 are combined together. Certainly, in some embodiments, as shown in FIG. 7, the protruding rib 316 can also be formed on the second protrusion 314 of the first case 3. Likewise, according to an ultrasonic welding technology, the protruding rib 316 on the second protrusion 314 of the first case 3 can be welded or implanted into the inner wall 412a of the second trench 412 of the second case 4, so that the first case 3 and the second case 4 are combined together.

Figure 8B:
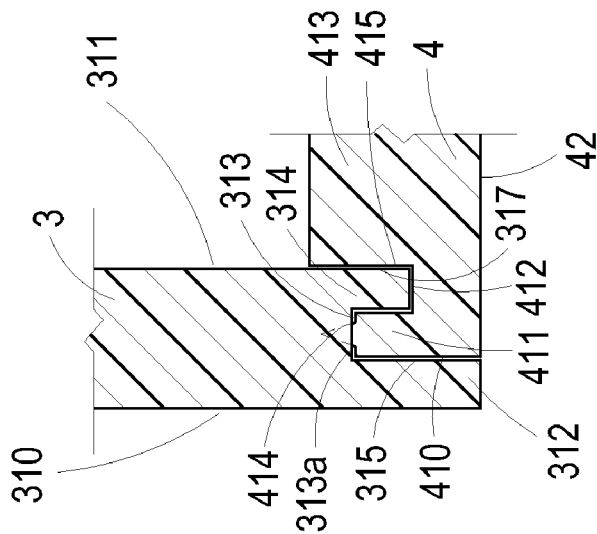
FIGS. 8A and 8B are schematic cross-sectional views showing the assembling process of the case assembly structure in FIG. 6.
Figure 8A:
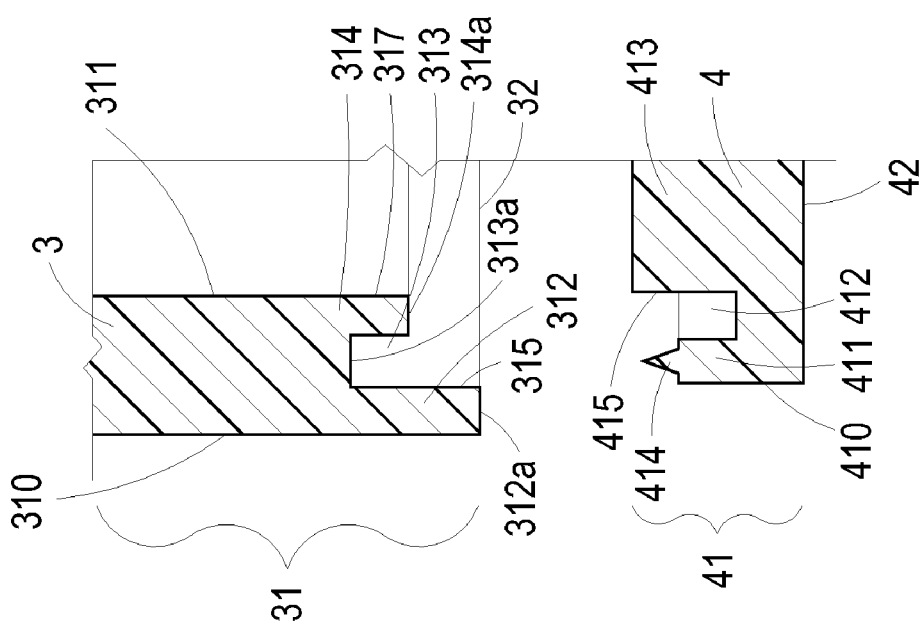

Please refer to FIGS. 8A and 8B, which are schematic cross-sectional views showing the assembling process of the case assembly structure in FIG. 6. As shown in FIG. 8A, for assembling the first case 3 and the second case 4, the first trench 313 and the second protrusion 314 of the first case 3 are firstly placed to face to the third protrusion 411 and the second trench 412 of the second case 4, respectively. Subsequently, the second case 4 is inserted into the entrance 32 of the first case 3; meanwhile, the third protrusion 411 of the second case 4 is received in the first trench 313 of the first case 3, the second protrusion 314 of the first case 3 is received in the second trench 412 of the second case 4, the inner wall 315 of the first protrusion 312 of the first case 3 is in close contact with the external side 410 of the second connection portion 41 of the second case 4, and the side 317 of the second protrusion 314 of the first case 3 is in close contact with the side 415 of the platform 413 of the second case 4. Then, according to an ultrasonic welding technology, the ultrasound generated by the horn of an ultrasonic plastic welding machine produces ultra-frequent sonic vibration on the cases. Under this circumstance, the first case 3 and the second case 4 rub against each other violently and thus the protruding rib 414 on the third protrusion 411 of the second case 4 will be welded or implanted into the inner wall 313a of the first trench 313 of the first case 3 in a very short time, as can be seen in FIG. 8B. Meanwhile, the purpose of assembling the first case 3 and the second case 4 is achieved.

In the above embodiments, the first case 3 and the second case 4 are combined together by the ultrasonic welding technology. It is noted that, however, those skilled in the art will readily observe that numerous modifications and alterations of the assembling method may be made while retaining the teachings of the invention. For example, if the protruding rib 414 on the third protrusion 411 of the second case 4 is dispensed, the first connection portion 31 of the first case 3 and the second connection portion 41 of the second case 4 may be tight-fitted. Alternatively, the first case 3 and the second case 4 may be combined together via adhesive. Alternatively, the first case 3 and the second case 4 may be combined together by screwing or fastening means.

As previously described, after the first case 3 and the second case 4 are assembled, the creepage distance formed between the connection portions 31 and 41 is obviously extended due to the cooperation of the inner wall 315 of the first protrusion 312 of the first case 3 and the external side 410 of the second connection portion 41 of the second case 4, and the cooperation of the side 317 of the second protrusion 314 of the first case 3 and the side 415 of the platform 413 of the second case 4. As the creepage distance is increased, the electric properties are enhanced. Moreover, since the inner wall 315 of the first protrusion 312 of the first case 3 is in close contact with the external side 410 of the second connection portion 41 of the second case 4 and the second case 4 is inserted into the entrance 32 of the first case 3, the bonding strength between the first case 3 and the second case 4 is largely enhanced. In a case that an external force is applied perpendicularly to the external side 310 of the first connection portion 31 of the first case 3, the second case 4 may facilitate the first protrusion 312 of the first case 3 to withstand a strong impact. Furthermore, the height of the second protrusion 314 of the first case 3 can be relatively reduced and the second protrusion 314 is received in the second trench 412 defined between the third protrusion 411 and the platform 413 of the second case 4, and thus, the possibility of causing fracture at the second protrusion 314 will be minimized, so as to enhance the strength of the case assembly structure.

From the above description, the case assembly structure of the present invention has specific profiles on the connection portions of the first case and the second case, and the second case is inserted into the entrance of the first case. By means of these specific profiles and connection designs, the case assembly structure of the present invention has an increased creepage distance, excellent electric properties and enhanced structural strength.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A case assembly structure of an electronic device, comprising:
   a first case having a first connection portion including a first protrusion, a first trench and a second protrusion from an external side to an internal side thereof; and
   a second case having a second connection portion including a third protrusion, a second trench and a platform from an external side to an internal side thereof;
   wherein said first trench and said second protrusion of said first connection portion of said first case are corresponding to said third protrusion and said second trench of said second connection portion of said second case, a side of said second protrusion of said first connection portion of said first case is in contact with a side of said platform of said second connection portion of said second case, and an inner wall of said first protrusion of said first connection portion of said first case is in contact with said external side of said second connection portion of said second case such that said first case and said second case are combined together.

2. The case assembly structure according to claim 1 wherein said second connection portion of said second case further includes a protruding rib on said third protrusion to be implanted into an inner wall of said first trench of said first case, or said first connection portion of said first case further includes a protruding rib on said second protrusion to be implanted into an inner wall of said second trench of said second case when said first case and said second case are combined together.

3. The case assembly structure according to claim 1 wherein a width of said third protrusion of said second case is slightly smaller than that of said first trench of said first case, and a width of said second protrusion of said first case is slightly smaller than that of said second trench of said second case.

4. The case assembly structure according to claim 1 wherein said first case and said second case are combined together by an ultrasonic welding technology.

5. The case assembly structure according to claim 1 wherein said external side of said first connection portion of said first case is substantially planar.

6. The case assembly structure according to claim 1 wherein said first case is a box, and said second case is a lid or a plate.

7. The case assembly structure according to claim 1 wherein an entrance is defined by said inner wall of said first protrusion of said first case, and said second case is inserted into said entrance of said first case.

8. The case assembly structure according to claim 7 wherein a tip of said first protrusion of said first case is substantially at the same level with a bottom surface of said second case when said second case is inserted into said entrance of said first case.

9. The case assembly structure according to claim 1 wherein said second trench is defined and formed between said third protrusion and said platform.

10. The case assembly structure according to claim 1 wherein an inner wall of said first protrusion of said first connection portion of said first case is in contact with said external side of said second connection portion of said second case.

11. A case assembly structure of an electronic device, comprising:
a first case having a first connection portion including a first protrusion, a first trench and a second protrusion from an external side to an internal side thereof, wherein an entrance is defined by said first protrusion of said first case; and
a second case having a second connection portion including a third protrusion, a second trench and a platform from an external side to an internal side thereof;
wherein said first trench and said second protrusion of said first connection portion of said first case are corresponding to said third protrusion and said second trench of said second connection portion of said second case, a side of said second protrusion of said first connection portion of said first case is in contact with a side of said platform of said second connection portion of said second case, and said second case is inserted into said entrance of said first case such that said first case and said second case are combined together.

12. The case assembly structure according to claim 11 wherein said second connection portion of said second case further includes a protruding rib on said third protrusion to be implanted into an inner wall of said first trench of said first case, or said first connection portion of said first case further includes a protruding rib on said second protrusion to be implanted into an inner wall of said second trench of said second case when said first case and said second case are combined together.

13. The case assembly structure according to claim 11 wherein a width of said third protrusion of said second case is slightly smaller than that of said first trench of said first case, and a width of said second protrusion of said first case is slightly smaller than that of said second trench of said second case.

14. The case assembly structure according to claim 11 wherein said first case and said second case are combined together by an ultrasonic welding technology.

15. The case assembly structure according to claim 11 wherein said external side of said first connection portion of said first case is substantially planar.

16. The case assembly structure according to claim 11 wherein said first case is a box, and said second case is a lid or a plate.

17. The case assembly structure according to claim 11 wherein a tip of said first protrusion of said first case is substantially at the same level with a bottom surface of said second case when said second case is inserted into said entrance of said first case.

18. The case assembly structure according to claim 11 wherein said second trench is defined and formed between said third protrusion and said platform.

* * * * *